United States Patent
Hwang (10) Patent No.: US 8,773,153 B2
(45) Date of Patent: Jul. 8, 2014

(54) METHOD OF CORRECTING OVERLAY AND SEMICONDUCTOR DEVICE MANUFACTURING METHOD USING THE SAME

(75) Inventor: Chan Hwang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 140 days.

(21) Appl. No.: 13/029,633

(22) Filed: Feb. 17, 2011

(65) Prior Publication Data

US 2011/0207247 A1 Aug. 25, 2011

(30) Foreign Application Priority Data

Feb. 19, 2010 (KR) .................. 10-2010-0015312

(51) Int. Cl.
*G01R 31/00* (2006.01)

(52) U.S. Cl.
USPC ............. 324/750.16; 324/750.23; 356/401; 438/16

(58) Field of Classification Search
CPC ...... G03F 9/005; G03F 9/7084; H01L 21/682
USPC ............. 356/486, 490; 324/750.23
See application file for complete search history.

(56) References Cited

U.S. PATENT DOCUMENTS

| | | | | |
|---|---|---|---|---|
| 5,912,983 A * | 6/1999 | Hiratsuka | .......... | 382/144 |
| 6,961,115 B2 * | 11/2005 | Hamatani et al. | .......... | 355/52 |
| 7,042,569 B2 * | 5/2006 | Sezginer et al. | .......... | 356/401 |
| 7,085,673 B2 * | 8/2006 | Picciotto et al. | .......... | 702/158 |
| 7,127,319 B2 * | 10/2006 | Byers et al. | .......... | 700/121 |
| 7,251,016 B2 * | 7/2007 | Froehlich et al. | .......... | 355/52 |
| 7,379,184 B2 * | 5/2008 | Smith et al. | .......... | 356/401 |
| 7,477,064 B2 * | 1/2009 | Kurihara et al. | .......... | 324/750.16 |
| 7,608,468 B1 * | 10/2009 | Ghinovker et al. | .......... | 438/16 |
| 7,804,994 B2 * | 9/2010 | Adel et al. | .......... | 382/151 |
| 2006/0078808 A1 * | 4/2006 | Cho | .......... | 430/22 |
| 2010/0063764 A1 * | 3/2010 | Lou et al. | .......... | 702/94 |
| 2011/0196646 A1 * | 8/2011 | Mos et al. | .......... | 702/150 |

FOREIGN PATENT DOCUMENTS

| | | |
|---|---|---|
| JP | 2002-334835 A | 11/2002 |
| JP | 2004-179663 A | 6/2004 |
| JP | 2007-311406 A | 11/2007 |
| KR | 10 2008-0008248 A | 1/2008 |

* cited by examiner

*Primary Examiner* — Richard Isla Rodas
(74) *Attorney, Agent, or Firm* — Lee & Morse, P.C.

(57) ABSTRACT

A method of correcting an overlay includes setting a reference map having information relating to predetermined positions of a substrate. An overlay value is measured at each of the predetermined positions to obtain a plurality of overlay measurement values. The plurality of overlay measurement values is applied to a polar coordinate function to calculate a correlation coefficient of the polar coordinate function. The polar coordinate function uses coordinate values of the predetermined positions as parameters.

7 Claims, 5 Drawing Sheets

METHOD OF CORRECTING OVERLAY AND SEMICONDUCTOR DEVICE MANUFACTURING METHOD USING THE SAME

BACKGROUND

1. Field

Embodiments relates to a semiconductor device manufacturing method, and more particularly, to a method of correcting an overlay value between two different layers and a semiconductor device manufacturing method using the same.

2. Description of the Related Art

An overlay measuring process may be used to detect a distortion degree between a lower pattern and an upper pattern formed on a substrate. The overlay measuring process may be performed at a plurality of positions on the substrate. Thus, a plurality of overlay measurement values can be obtained on a single substrate. The plurality of overlay measurement values may be different from each other.

Methods of correcting an overlay; however, may exhibit a disadvantage in that reliability of the overlay measuring process is deteriorated based on a lack of improvement in the uniformity of the several overlay measurement values.

SUMMARY

Embodiments are directed to a method of correcting an overlay value.

Embodiments are also directed to a method of fabricating a semiconductor device using the method of correcting an overlay value.

Exemplary embodiments provide a method of correcting an overlay. The method of correcting the overlay includes setting a reference map having information relating to predetermined positions of a substrate. An overlay value is measured at each of the predetermined positions to obtain a plurality of overlay measurement values. The plurality of overlay measurement values is applied to a polar coordinate function to calculate a correlation coefficient of the polar coordinate function. The polar coordinate function uses coordinate values of the predetermined positions as parameters.

In some embodiments, the polar coordinate function may include a Zernike polynomial.

In other embodiments, the Zernike polynomial may include a plurality of terms of 1, $R \cos \theta$, $R \sin \theta$, $(2R^2 - 1)$, $R^2 \cos \theta$, $R^2 \sin \theta$, $(3R^3 - 2R)\cos \theta$, $(3R^3 - 2R)\sin \theta$, $(6R^4 - 6R^2 + 1)$, $R^3 \cos 3\theta$, $R^3 \sin 3\theta$, $(4R^4 - 3R^2)\cos 2\theta$, $(4R^4 - 3R^2)\sin 2\theta$, $(10R^5 - 12R^3 + 3R)\cos \theta$, $(10R^5 - 12R^3 + 3R)\sin \theta$, $20R^6 - 30R^4 + 12R^2 - 1$, $R^4 \cos 4\theta$, $R^4 \sin 4\theta$, $(5R^5 + 4R^3)\cos 3\theta$, $(5R^5 + 4R^3)\sin 3\theta$, $(15R^6 - 20R^4 + 6R^2)\cos 2\theta$, $(15R^6 - 20R^4 + 6R^2)\sin 2\theta$, $(35R^7 - 60R^5 + 30R^3 - 4R)\cos \theta$, $(35R^7 - 60R^5 + 30R^3 - 4R)\sin \theta$, and $70R^8 - 140R^6 + 90R^4 - 20R^2 + 1$.

In still other embodiments, the polar coordinate function may include the product of the Zernike polynomial and the correlation coefficient.

In even other embodiments, the product of the Zernike polynomial and the correlation coefficient may include $C_0 + C_2 R \cos \theta + C_4 R \sin \theta + C_6 (2R^2 - 1) + \ldots$.

In yet other embodiments, the $C_0$ may correspond to an offset deformation value of the overlay measurement values.

In further embodiments, the $C_2$ and $C_4$ may correspond to a scale deformation value of the overlay measurement values.

In still further embodiments, the $C_6$ may correspond to a high-order deformation value.

In even further embodiments, the product of the Zernike polynomial and the correlation coefficient may include the product of a Zernike polynomial matrix and a correlation coefficient matrix.

In yet further embodiments, the product of the Zernike polynomial matrix and the correlation coefficient matrix may include:

$$\begin{bmatrix} 1 & R_1\cos\theta_1 & R_1\sin\theta_1 & 2R_1^2 - 1 & \ldots \\ 1 & R_2\cos\theta_2 & R_2\sin\theta_2 & 2R_2^2 - 1 & \ldots \\ 1 & R_3\cos\theta_3 & R_3\sin\theta_3 & 2R_3^2 - 1 & \ldots \\ \vdots & \vdots & \vdots & \vdots & \vdots \\ 1 & R_n\cos\theta_n & R_n\sin\theta_n & 2R_n^2 - 1 & \ldots \end{bmatrix} \begin{bmatrix} C_0 \\ C_2 \\ C_4 \\ \vdots \\ C_{2n-2} \end{bmatrix}$$

In yet further embodiments, the product of the Zernike polynomial matrix and the correlation coefficient matrix may correspond to a matrix of the plurality of overlay measurement values.

In yet further embodiments, the matrix of the plurality of overlay measurement values may include:

$$\begin{bmatrix} dx_1 \\ dx_2 \\ dx_3 \\ \vdots \\ dx_n \end{bmatrix}$$

In yet further embodiments, the correlation coefficient matrix may correspond to the product of a Zernike polynomial transposed matrix and the matrix of the plurality of overlay measurement values.

In yet further embodiments, the product of a Zernike polynomial transposed matrix and the matrix of the plurality of overlay measurement values may include:

$$\begin{bmatrix} 1 & 1 & 1 & \ldots & 1 \\ R_1\cos\theta_1 & R_2\cos\theta_2 & R_3\cos\theta_3 & \ldots & R_n\cos\theta_n \\ R_1\sin\theta_1 & R_2\sin\theta_2 & R_3\sin\theta_3 & \ldots & R_n\sin\theta_n \\ 2R_1^2 - 1 & 2R_2^2 - 1 & 2R_3^2 - 1 & \ldots & 2R_n^2 - 1 \\ \vdots & \vdots & \vdots & \vdots & \vdots \end{bmatrix} \begin{bmatrix} dx_1 \\ dx_2 \\ dx_3 \\ \vdots \\ dx_n \end{bmatrix}$$

In yet further embodiments, the method may further include multiplying the correlation coefficient matrix by the Zernike polynomial matrix to calculate an overlay correction value corresponding to each of related position coordinate values in the entire surface of the substrate. The Zernike polynomial matrix uses each of the related position coordinate values as a parameter.

In yet further embodiments, the method may further include generating a correction map by updating the reference map with the overlay correction value.

Exemplary embodiments also provide a method of manufacturing a semiconductor device. The method of manufacturing the semiconductor device includes forming a lower pattern on a substrate in a unit process equipment, forming an upper pattern on the lower pattern by using a reference map in an exposure equipment, and correcting an overlay. Correcting the overlay includes setting a reference map having information relating to predetermined positions of a substrate. An overlay value is measured at each of the predetermined positions to obtain a plurality of overlay measurement values corresponding to a distortion degree between the lower pattern and the upper pattern. The plurality of overlay measurement values is applied to a polar coordinate function to calculate a correlation coefficient of the polar coordinate function. The polar coordinate function uses coordinate values of the predetermined positions as parameters.

In some embodiments, the polar coordinate function may include a Zernike polynomial.

In other embodiments, correcting the overlay may further include applying the correlation coefficient to the polar coordinate function using each of related position coordinate values in the entire reference map as a parameter to calculate an overlay correction value in the related position coordinate value, and generating a correction map of which the related positions of the reference map are corrected with an overlap correction value.

In still other embodiments, correcting the overlay may further include sending the correction map to the exposure equipment in the overlay measuring equipment.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Korean Patent Application No. 10-2010-0015312, filed on Feb. 19, 2010, in the Korean Intellectual Property Office, and entitled: "Method of Correcting Overlay and Semiconductor Device Manufacturing Method Using the Same," is incorporated by reference herein in its entirety.

Hereinafter, exemplary embodiments will be described in detail with reference to the accompanying drawings. Features of the present invention and methods of accomplishing the same may be understood more readily by reference to the following detailed description of preferred embodiments and the accompanying drawings. The embodiments may, however, be embodied in many different forms and should not be construed as being limited to the embodiments set forth herein. Rather, these embodiments are provided so that this disclosure will be thorough and complete and will fully convey the scope of the inventive concept to those skilled in the art, and the embodiments of the inventive concept will only be defined by the appended claims. Like reference numerals refer to like elements throughout the specification.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated elements, steps, operations, and/or components, but do not preclude the presence or addition of one or more other elements, steps, operations, components, and/or groups thereof.

Figure 1:
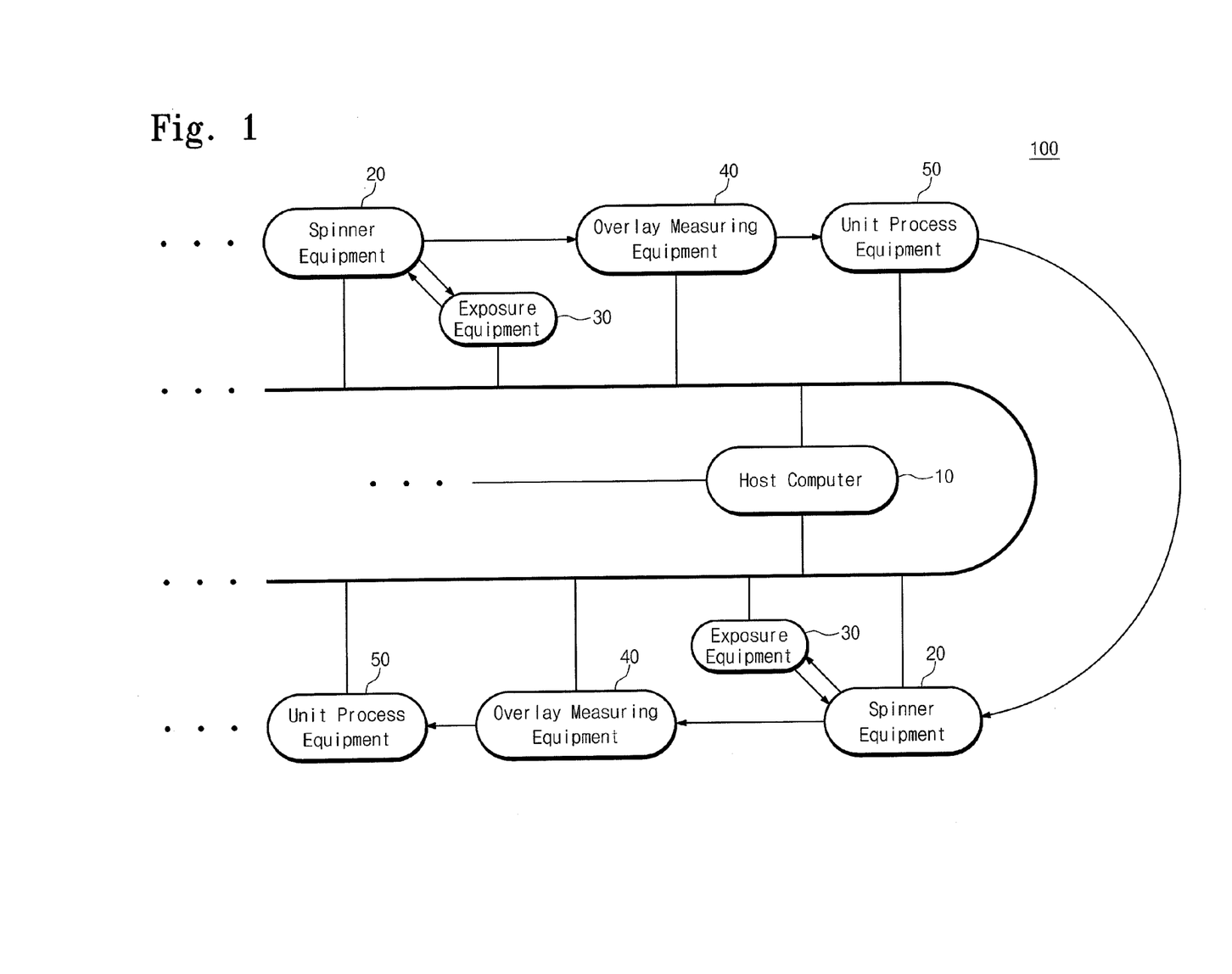
FIG. 1 illustrates a schematic diagram of a semiconductor device manufacturing equipment used in a method of correcting an overlay according to an exemplary embodiment.

FIG. 1 is a schematic diagram of a semiconductor device manufacturing equipment used in a method of correcting an overlay according to an exemplary embodiment.

Referring to FIG. 1, a semiconductor device manufacturing equipment 100 may include at least one overlay measuring equipment 40 and at least one exposure equipment 30. The overlay measuring equipment 40 measures at least one overlay value which may correspond to a distortion degree between a lower pattern on a substrate and a photoresist pattern on the lower pattern. The distortion degree may comprise a misalignment value between the lower pattern and the photoresist pattern. The exposure equipment 30 may have a function to selectively expose some portions of a photoresist layer using a mask pattern. The overlay measuring equipment 40 may calculate an overlay correction value using the measured overlay value and may generate a correction map using the overlay correction value. The exposure equipment 30 may receive the overlay correction value and the correction map, thereby performing a new exposure process to reflect the correction map.

The overlay measuring equipment 40 may communicate data such as the overlay measurement value and the overlay correction value calculated from the overlay measurement value with the exposure equipment 30 via a host computer 10 or a server. The overlay measuring equipment 40 and the exposure equipment 30 may have information regarding a reference map. The reference map may include at least one coordinate indicating at least one reference position of the substrate. Moreover, the overlay measuring equipment 40 and the exposure equipment 30 may update the reference map to make the overlay correction value and may generate the correction map.

The semiconductor device manufacturing equipment 100 may further include at least one spinner equipment 20. The spinner equipment 20 may have a function to form the photoresist layer on the substrate. Moreover, the spinner equipment 20 may have another function to develop the photoresist layer which is exposed by the exposure equipment 30. As a result, the photoresist pattern is finally formed by the spinner equipment 20. The overlay measuring equipment 40 may perform an overlay measuring process to measure the overlay value between the lower pattern and the photoresist pattern using an optical microscopy.

The semiconductor device manufacturing equipment 100 may further comprise at least one unit process equipment 50. The unit process equipment 50 may comprise at least one of various apparatus. For example, the unit process equipment 50 may comprise at least one selected from the group consisting of an etching apparatus, a deposition apparatus, an ion implantation apparatus, an ashing apparatus for removing a photoresist pattern, and a cleaning apparatus.

Semiconductor device manufacturing methods will be described using the above-described semiconductor device manufacturing equipment 100.

Figure 2:
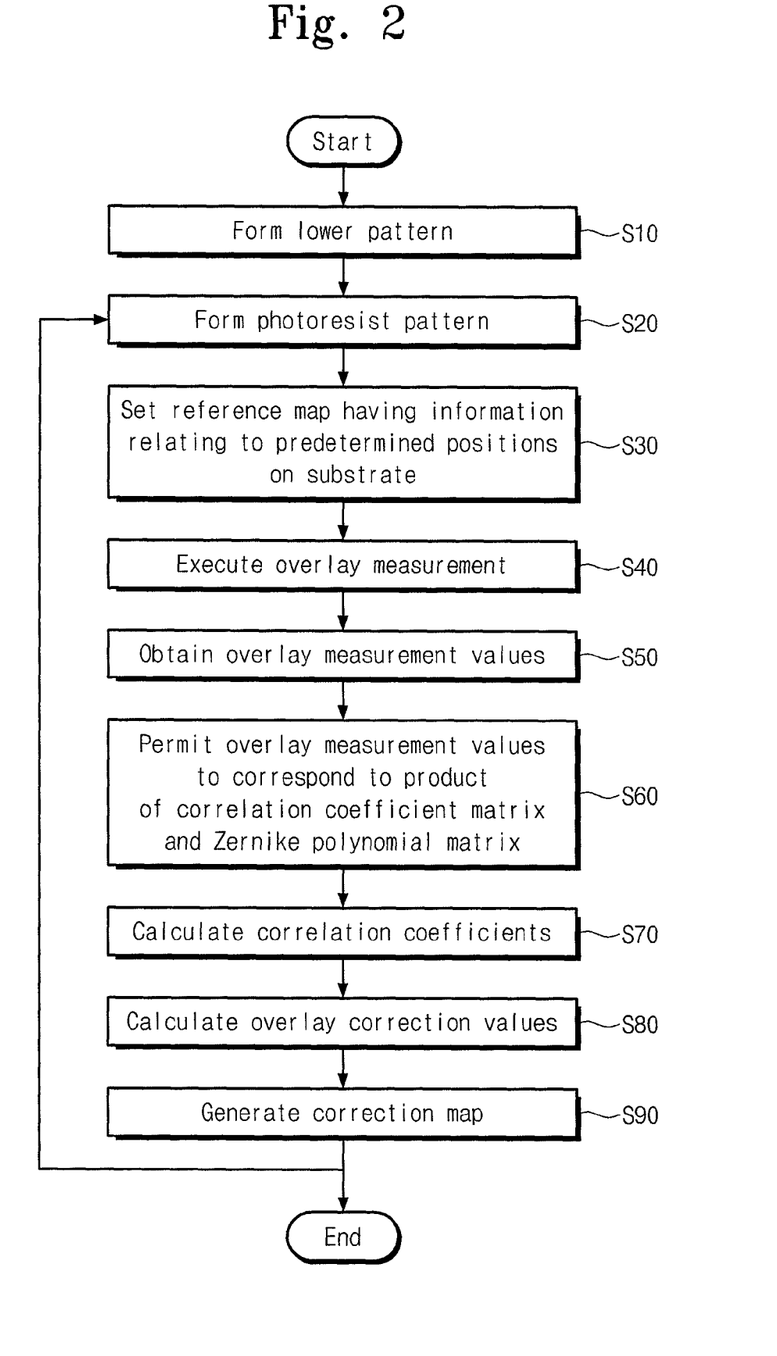
FIG. 2 illustrates a flowchart of a method of fabricating a semiconductor device according to an exemplary embodiment.
Figure 3:
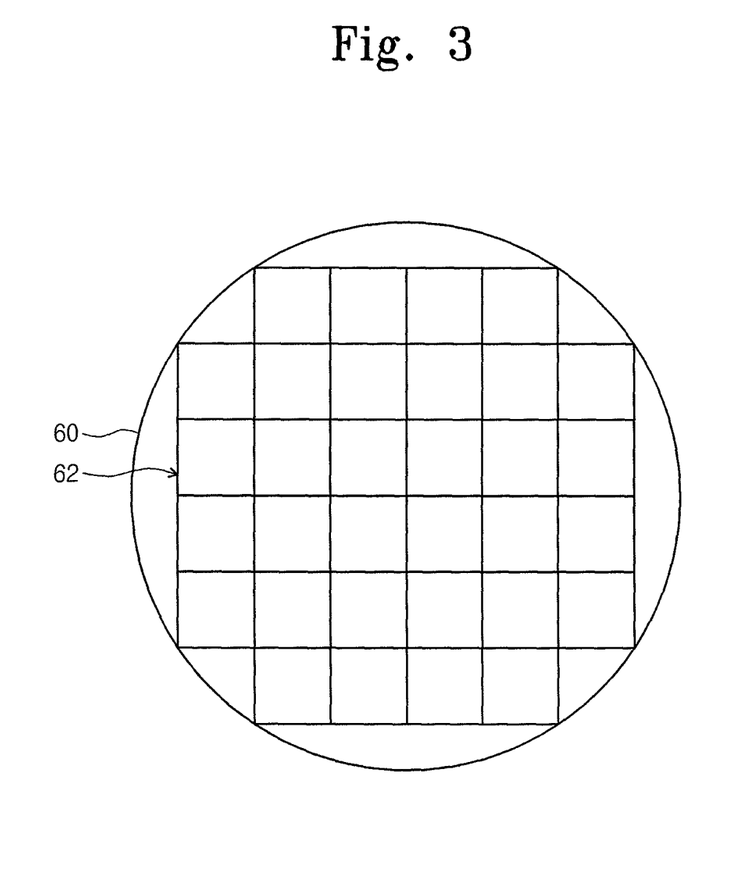
FIGS. 3 through 5 illustrate plan views of a method of fabricating a semiconductor device according to an exemplary embodiment.
Figure 4:
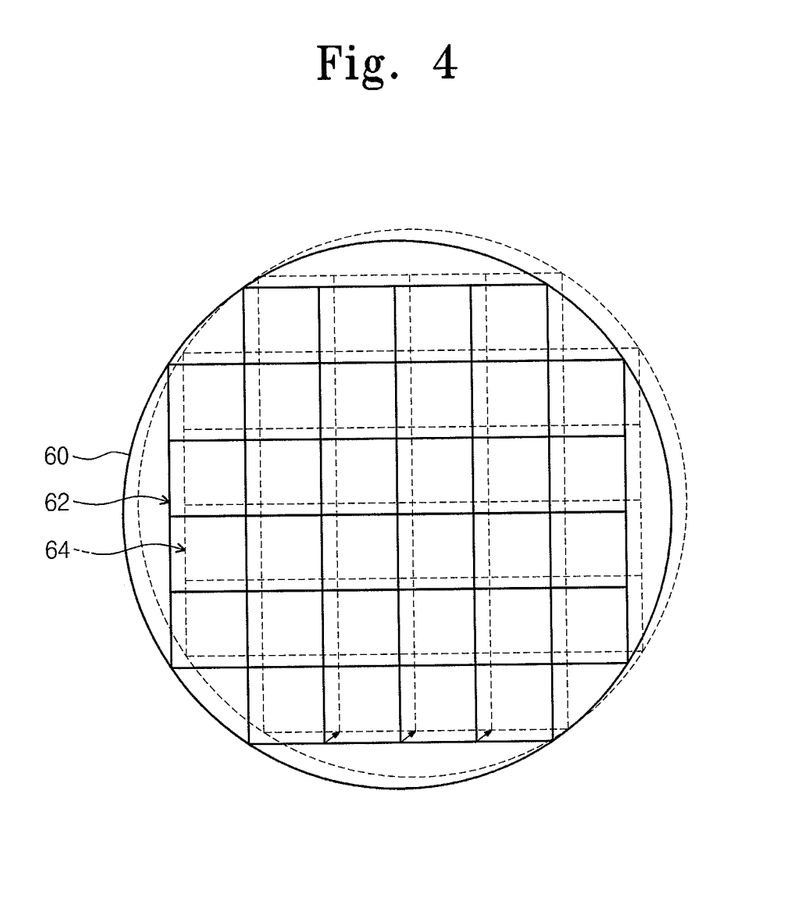
Figure 5:
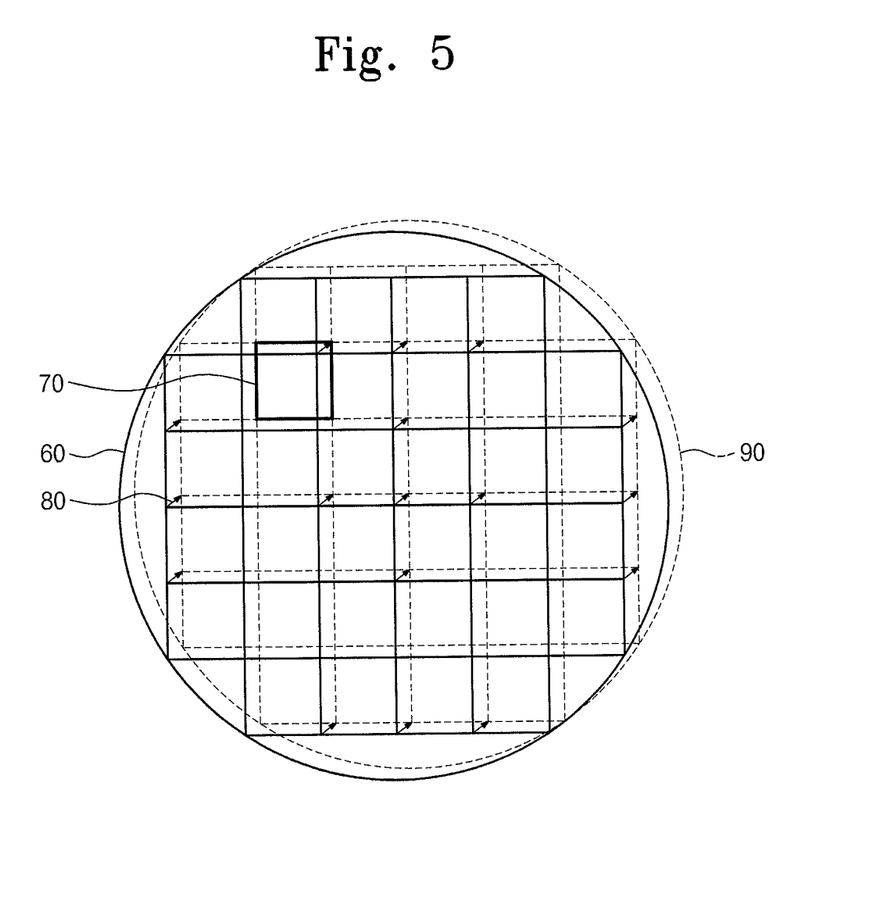

FIG. 2 is a flowchart illustrating the methods of fabricating a semiconductor device according to an exemplary embodiment, and FIGS. 3 through 5 are plan views illustrating the methods of fabricating a semiconductor device according to an exemplary embodiment.

Referring to FIGS. 2 and 3, a lower pattern 62 is formed on a substrate 60 (S10). The lower pattern 62 may be formed by the unit process equipment 50. The lower pattern 62 may be formed on an entire surface of the substrate 60. The lower pattern 62 may include various lower overlay patterns which are used in the overlay measuring process. The lower overlay patterns may serve as reference patterns upon measuring the overlay. The lower pattern 62 may be formed on the substrate 60 using a lower photoresist pattern as a mask pattern. Subsequently, the lower photoresist pattern on the substrate 60 may be removed. Moreover, a thin film may be deposited on the lower pattern 62 using the deposition apparatus of the unit process equipment 50.

Subsequently, referring to FIGS. 2 and 4, a photoresist pattern 64 is formed on the substrate 60 (S20). The photoresist pattern 64 is an upper pattern formed on the lower pattern 62. The photoresist pattern 64 may be formed by the spinner equipment 20 and the exposure equipment 30. As described above, the spinner equipment 20 is capable of coating a photoresist layer on the substrate 60. The exposure equipment 30 is capable of exposing the photoresist layer in accordance with a predetermined-shaped mask pattern. The spinner equipment 20 is again used to develop the photoresist layer which is exposed by the exposure equipment 30. The exposure equipment 30 is capable of exposing about 100 or more shots with the same shape on the substrate 60. Thus, the photoresist pattern 64 may include a plurality of upper overlay patterns.

Each of the upper overlay patterns may serve as an overlay pattern used to detect a distortion degree of the photoresist pattern with respect to the corresponding reference pattern upon measuring the overlay. Ideally, when the lower pattern 62 and the photoresist pattern 64 are formed using a single reference map in the exposure equipment 30, the photoresist pattern 64 and the lower pattern 62 may be perfectly aligned (or matched) with each other at all the positions of the substrate 60. In fact, however, the photoresist pattern 64 and the lower pattern 62 may be misaligned (or unmatched) with each other. In particular, the misalignment values (e.g., the overlay values) between the lower pattern 62 and the photoresist pattern 64 may not be uniform at all the positions of the substrate 60. That is, the misalignment values between the lower pattern 62 and the photoresist pattern 64 may be different from each other. For example, the photoresist pattern 64 may be formed on the entire surface of the substrate 60 so as to be deformed in an offset manner by a certain distance from the lower pattern 62. Alternatively, the photoresist pattern 64 may be formed so as to be deformed in a scale manner in proportion by a distance distant from the center of the substrate 60 in an edge direction. These problems may be due to the natures of the exposure equipment 30 that exposes the photoresist layer using spherical lens As an alternative method of compensating the unmatched formation of the photoresist pattern 64 over the lower pattern 62, there may be used a method of correcting the reference map. That is, it may be required to correct or compensate the initial reference map in order to improve the uniformity of the overlay values and reduce the magnitude of each of the overlay values. The corrected reference map, e.g., the compensated reference map is referred to as a correction map or a compensation map. The exposure equipment 30 and the spinner equipment 20 may form a new photoresist pattern using the correction map corrected with an overlap correction value calculated in the overlay measuring equipment 40. In consideration of throughput or productivity, the overlay measuring equipment 40 may perform an overlap measuring process on several shots selected from all shots of the substrate 60. The overlay measuring equipment 40 may calculate a correlation coefficient by applying the overlay measurement values obtained from the overlay measuring process to a polar coordinate function. Then, overlay measuring equipment 40 may manage the overlay for the entire shots on the substrate 60 by use of the correlation coefficient. A method of correcting the overlay will be hereinafter described in detail.

The semiconductor device manufacturing equipment 100 may generate a reference map, that is, an initial reference map. The reference map may have information relating to at least one position on the substrate 60. For example, the reference map may have information relating to a plurality of predetermined positions selected from all positions of the substrate. In an embodiment, each position may indicate a coordinate of any one of all semiconductor chips formed on the substrate. In another embodiment, the predetermined positions may comprise, e.g., 5 positions which are located at a top region, a central region, a bottom region, a left region, and a right region of the substrate. The overlay measuring equipment 40 receives the reference map from the host computer 10 or the exposure equipment 30. The overlay measuring equipment 40 may recognize the information regarding the predetermined positions on the substrate 60, and the overlay measuring equipment 40 may move the optical microscopy to the predetermined positions.

Subsequently, the overlay measuring equipment 40 performs the overlay measuring process at predetermined positions of the substrate 60 (S40). That is, the overlay measuring equipment 40 may measure the overlay values at the predetermined positions. The predetermined positions may be selected by the reference map. At this time, the coordinates of the selected positions may be transferred or stored into the overlay measuring equipment 40 by an operator or the host computer 10. The positions of the reference map may be expressed by the Cartesian coordinate system and the polar coordinates. The overlay measuring equipment 40 may acquire a measured image indicating the lower pattern 62 and the photoresist pattern 64 on the substrate 60 at every position.

Subsequently, the overlay measuring equipment 40 may acquire the overlay measurement value by use of the measured image (S50). The overlay measurement value may correspond to the distorted distance of the lower pattern 62 and the photoresist pattern 64 indicated by the measured image. The overlay measurement value may be changed into an X-axis component and a Y-axis component in the Cartesian coordinate system. The overlay measuring equipment 40 may acquire the plurality of overlay measurement values at all the positions to find out a certain regularity of the overlay measurement values on the entire surface of the substrate 60.

Referring to FIG. 5, the overlay measuring equipment 40 may obtain the plurality of overlay measurement values 80 at some positions corresponding to about fifteen to about twenty shots 70 on a single substrate 60. Here, the plurality of overlay measurement values 80 are illustrated to more easily explain the overlay as the values measured using images inside the shots 70. Reference Numeral "90" denotes an overlay of the photoresist pattern 64 formed on the substrate 60.

As described above, the plurality of overlay measurement values 80 have to be ideally acquired as "0" or a value similar to "0". In fact, however, the overlay measurement values may be acquired as different values distributed in the overlay measurement. The overlay measuring equipment 40 may find out the regularity of the plurality of overlay measurement values 80 to generate the correction map. In an exemplary embodiment, the overlay measuring equipment 40 may perform an overlay measurement process only at some positions of all the positions in order to generate the correction map. This is because the productivity may be reduced when the overlay measuring process is performed at the positions of all the shots 70 in the semiconductor device manufacturing process.

The regularity of the plurality of overlay measurement values 80 may be given by the following regressive equation 1.

$$U = AK \quad \text{<Equation 1>}$$

wherein, "U" represents the plurality of overlay measurement values 80 and "AK" represents a basis function.

The basis function may have parameters corresponding to the coordinates of the positions obtained by the plurality of overlay measurement values 80. Hereinafter, the parameters correspond to the coordinates of the positions, but may be explained as corresponding to the positions. The parameters may include a radial component (R) and an azimuth angle component (θ). The basis function may include a polar coordinate function in which the radial (R) component and the azimuth angle (θ) component act as independent variables. For example, the polar coordinate function may include a polynomial function (A) and a correlation coefficient (K). Therefore, the polar coordinate function corresponds to the product of the polynomial function (A) and the correlation coefficient (K). The correlation coefficient (K) may be a management parameter of the overlay measuring equipment 40 for generating the correction map. The overlay measuring equipment 40 may improve uniformity of the plurality of overlay measurement values 80 by managing the correlation coefficient (K). When the plurality of overlay measurement values 80 and the basis function are expressed as a matrix, the correlation coefficient (K) may be calculated by the following equations 2-1 and 2-2.

$$A^T U = A^T A K \quad \text{<Equation 2-1>}$$

$$A^T U = K \quad \text{<Equation 2-2>}$$

wherein, "A" represents a matrix of the polynomial function, and "$A^T$" represents a transposed matrix of the polynomial function.

When the matrix of the polynomial function is orthogonal to the transposed matrix, $A^T A$ may be a unit matrix. "U" is a matrix of the plurality of overlay measurement values and "K" is a correlation coefficient matrix.

Accordingly, the overlay measuring equipment 40 may fit the plurality of overlay measurement values 80 to the basis function to calculate the correlation coefficients of the basis function for generating the correction map.

In an embodiment, the polynomial function may include a Zernike polynomial. The Zernike polynomial may be expressed by the product of a radial polynomial component and a trigonometric function component. For example, the Zernike polynomial may be expressed by the following equations 3-1 and 3-2.

$$Z_n^{-m}(\rho,\phi) = {}^oU_n^m(\rho,\phi) = R_n^m(\rho)\sin(m\phi) \quad \text{<Equation 3-1>}$$

$$Z_n^m(\rho,\phi) = {}^eU_n^m(\rho,\phi) = R_n^m(\rho)\cos(m\phi) \quad \text{<Equation 3-2>}$$

wherein, φ represents an azimuth angle in radians within a range of $0 \leq \phi \leq 2\pi$ and "ρ" represents a radial distance of $0 \leq \rho \leq 1$.

The Zernike polynomial uses the radial component and the azimuth angle component as the parameters, and the radial component and the azimuth angle component are orthogonal to each other at each position on the circular substrate 60 having a normalized radial distance. Thus, it is possible to optimize the uniformity of the plurality of overlay measurement values. The Zernike polynomial may be expressed by even polynomials and odd polynomials. For example, the Zernike polynomial may include the sum of $Z_0^0=1$, $Z_1^{-1}=\rho \cos \phi$, $Z_1^{-1}=\rho \sin \phi$, $Z_2^0=2\rho^2-1$, . . . .

Accordingly, the plurality of overlay measurement values 80 may be the product of the Zernike polynomial and the correlation coefficient, as expressed by the following equations 4-1 and 4-2.

$$dx = C_0 + C_2 R \cos\theta + C_4 R \sin\theta + C_6(2R^2-1) + \quad \text{<Equation 4-1>}$$

$$dy = C_1 + C_3 R \cos\theta + C_5 R \sin\theta + C_7(2R^2-1) + \quad \text{<Equation 4-2>}$$

wherein, "dx" and "dy" indicate the overlay measurement values of the Cartesian coordinate system, and "$C_0, C_2, C_4, C_6, \ldots$" and "$C_1, C_3, C_5, C_7, \ldots$" indicate the correlation coefficients of the X-axis component and the Y-axis component, respectively.

In an embodiment, "$C_0$" and "$C_1$" may be correlation coefficients relating to offset deformation. "$C_2$" and "$C_3$" may be correlation coefficients relating to scale deformation in the X-axis direction. "$C_4$" and "$C_5$" may be correlation coefficients relating to scale deformation in the Y-axis direction. "$C_6$" and "$C_7$" may be correlation coefficients relating to high-order deformation. "$C_8, \ldots$" and "$C_9, \ldots$" higher than "$C_6$" and "$C_7$" may also be the correlation coefficients relating to high-order deformation.

Accordingly, the overlay measuring equipment 40 may improve the uniformity of the plurality of overlay measurement values by mainly managing the correlation coefficients relating to the offset deformation or the scale deformation. The overlay measuring equipment 40 may further improve the uniformity of the overlay measurement values by managing the correlation coefficients multiplied by the Zernike polynomials in which "m" is 4 or less in the equation 3. For example, the overlay measuring equipment 40 may multiply the correlation coefficients by 1, R cos θ, R sin θ, $(2R^2-1)$, $R^2 \cos\theta$, $R^2 \sin\theta$, $(3R^3-2R)\cos\theta$, $(3R^3-2R)\sin\theta$, $(6R^4-6R^2+1)$, $R^3 \cos 3\theta$, $R^3 \sin 3\theta$, $(4R^4-3R^2)\cos 2\theta$, $(4R^4-3R^2)\sin 2\theta$, $(10R^5-12R^3+3R)\cos\theta$, $(10R^5-12R^3+3R)\sin\theta$, $20R^6-30R^4+12R^2-1$, $R^4 \cos 4\theta$, $R^4 \sin 4\theta$, $(5R^5+4R^3)\cos 3\theta$, $(5R^5+4R^3)\sin 3\theta$, $(15R^6-20R^4+6R^2)\cos 2\theta$, $(15R^6-20R^4+6R^2)\sin 2\theta$, $(35R^7-60R^5+30R^3-4R)\cos\theta$, $(35R^7-60R^5+30R^3-4R)\sin\theta$, and $70R^8-140R^6+90R^4-20R^2+1$.

The plurality of overlay measurement values 80 may be expressed by matrixes such as the following equations 5-1 and 5-2.

$$\begin{bmatrix} dx_1 \\ dx_2 \\ dx_3 \\ \vdots \\ dx_n \end{bmatrix} = \begin{bmatrix} 1 & R_1\cos\theta_1 & R_1\sin\theta_1 & 2R_1^2-1 & \ldots \\ 1 & R_2\cos\theta_2 & R_2\sin\theta_2 & 2R_2^2-1 & \ldots \\ 1 & R_3\cos\theta_3 & R_3\sin\theta_3 & 2R_3^2-1 & \ldots \\ \vdots & \vdots & \vdots & \vdots & \vdots \\ 1 & R_n\cos\theta_n & R_n\sin\theta_n & 2R_n^2-1 & \ldots \end{bmatrix} \begin{bmatrix} C_0 \\ C_2 \\ C_4 \\ \vdots \\ C_{2n-2} \end{bmatrix} \quad \text{<Equation 5-1>}$$

$$\begin{bmatrix} dy_1 \\ dy_2 \\ dy_3 \\ \vdots \\ dy_n \end{bmatrix} = \begin{bmatrix} 1 & R_1\cos\theta_1 & R_1\sin\theta_1 & 2R_1^2-1 & \ldots \\ 1 & R_2\cos\theta_2 & R_2\sin\theta_2 & 2R_2^2-1 & \ldots \\ 1 & R_3\cos\theta_3 & R_3\sin\theta_3 & 2R_3^2-1 & \ldots \\ \vdots & \vdots & \vdots & \vdots & \vdots \\ 1 & R_n\cos\theta_n & R_n\sin\theta_n & 2R_n^2-1 & \ldots \end{bmatrix} \begin{bmatrix} C_1 \\ C_3 \\ C_5 \\ \vdots \\ C_{2n-1} \end{bmatrix} \quad \text{<Equation 5-2>}$$

wherein, "$dx_1$" and "$dy_1$" may be overlap measurement values measured at positions of "$x_1$" and "$y_1$" in the Cartesian coordinate system, respectively. "$R_1$" and "$\theta_1$" may correspond to the radial component and the azimuth angle component in the polar coordinate system for indicating the positions of "$x_1$" and "$y_1$", respectively. "$R_1$" may be a normalized radial distance having a value of $0 \leq R \leq 1$. Likewise, "$dx_2, dx_3, \ldots, dx_n$" and "$dy_e, dy_3, \ldots, dy_n$" may be overlap measurement values measured at the positions of "$x_2$, $x_3$, ..., $x_n$" and "$y_2, y_3, ..., y_n$", respectively. "$R_2, R_3, ..., R_n$" and "$\theta_2, \theta_3, ..., \theta_n$" may also correspond to the radial components and the azimuth angle components in the polar coordinate system for indicating the positions of "$x_2, x_3, ..., x_n$" and "$y_2, y_3, ..., y_n$", respectively.

The matrix of the overlay measurement values may correspond to the product of a correlation coefficient matrix and the Zernike polynomial matrix in which the random positions are parameters. Therefore, the overlay measuring equipment 40 permits the plurality of overlay measurement values to correspond to the product of a correlation coefficient matrix and the Zernike polynomial matrix (S60).

The correlation coefficient matrix may be obtained by multiplying the Zernike polynomial transposed matrix by the equations 5-1 and 5-2 on the basis of the equation 2-1 or 2-2. The Zernike polynomial guarantees the orthogonality between the parameters and has no collinearity corresponding to the correlation between individual components of a polynomial. The Zernike polynomial matrix may have "0" in all of the diagonal areas and the non-diagonal areas, when the Zernike polynomial transposed matrix is multiplied. Accordingly, the product of the Zernike polynomial matrix and the Zernike polynomial transposed matrix may be a unit matrix as denoted by the following equation 6-1 or 6-2.

$$\begin{bmatrix} 1 & R_1\cos\theta_1 & R_1\sin\theta_1 & 2R_1^2-1 & \dots \\ 1 & R_2\cos\theta_2 & R_2\sin\theta_2 & 2R_2^2-1 & \dots \\ 1 & R_3\cos\theta_3 & R_3\sin\theta_3 & 2R_3^2-1 & \dots \\ \vdots & \vdots & \vdots & \vdots & \vdots \\ 1 & R_n\cos\theta_n & R_n\sin\theta_n & 2R_n^2-1 & \dots \end{bmatrix}^T \quad \langle\text{Equation 6-1}\rangle$$

$$\begin{bmatrix} dx_1 \\ dx_2 \\ dx_3 \\ \vdots \\ dx_n \end{bmatrix} = \begin{pmatrix} 1 & 0 & 0 & 0 & \dots \\ 0 & 1 & 0 & 0 & \dots \\ 0 & 0 & 1 & 0 & \dots \\ \vdots & \vdots & \vdots & \vdots & \vdots \\ 0 & 0 & 0 & 0 & \dots \end{pmatrix} \begin{bmatrix} C_0 \\ C_2 \\ C_4 \\ \vdots \\ C_{2n-2} \end{bmatrix}$$

$$\begin{bmatrix} 1 & R_1\cos\theta_1 & R_1\sin\theta_1 & 2R_1^2-1 & \dots \\ 1 & R_2\cos\theta_2 & R_2\sin\theta_2 & 2R_2^2-1 & \dots \\ 1 & R_3\cos\theta_3 & R_3\sin\theta_3 & 2R_3^2-1 & \dots \\ \vdots & \vdots & \vdots & \vdots & \vdots \\ 1 & R_n\cos\theta_n & R_n\sin\theta_n & 2R_n^2-1 & \dots \end{bmatrix}^T \begin{bmatrix} dy_1 \\ dy_2 \\ dy_3 \\ \vdots \\ dy_n \end{bmatrix} = \quad \langle\text{Equation 6-2}\rangle$$

$$\begin{pmatrix} 1 & 0 & 0 & 0 & \dots \\ 0 & 1 & 0 & 0 & \dots \\ 0 & 0 & 1 & 0 & \dots \\ \vdots & \vdots & \vdots & \vdots & \vdots \\ 0 & 0 & 0 & 0 & \dots \end{pmatrix} \begin{bmatrix} C_1 \\ C_3 \\ C_5 \\ \vdots \\ C_{2n-1} \end{bmatrix}$$

In the equations 6-1 and 6-2, the product of the Zernike polynomial matrix and the Zernike polynomial transposed matrix may be expressed as a unit matrix with "ones" on the main diagonal or may be expressed as a unit matrix multiplied by a constant. When the Zernike polynomial transposed matrix is calculated and the unit matrix is removed, the equations 6-1 and 6-2 may be changed into the following equations 7-1 and 7-2, respectively.

$$\begin{bmatrix} 1 & 1 & 1 & \dots & 1 \\ R_1\cos\theta_1 & R_2\cos\theta_2 & R_3\cos\theta_3 & \dots & R_n\cos\theta_n \\ R_1\sin\theta_1 & R_2\sin\theta_2 & R_3\sin\theta_3 & \dots & R_n\sin\theta_n \\ 2R_1^2-1 & 2R_2^2-1 & 2R_3^2-1 & \dots & 2R_n^2-1 \\ \vdots & \vdots & \vdots & \vdots & \vdots \end{bmatrix} \begin{bmatrix} dx_1 \\ dx_2 \\ dx_3 \\ \vdots \\ dx_n \end{bmatrix} = \quad \langle\text{Equation 7-1}\rangle$$

$$\begin{bmatrix} C_0 \\ C_2 \\ C_4 \\ \vdots \\ C_{2n-2} \end{bmatrix}$$

$$\begin{bmatrix} 1 & 1 & 1 & \dots & 1 \\ R_1\cos\theta_1 & R_2\cos\theta_2 & R_3\cos\theta_3 & \dots & R_n\cos\theta_n \\ R_1\sin\theta_1 & R_2\sin\theta_2 & R_3\sin\theta_3 & \dots & R_n\sin\theta_n \\ 2R_1^2-1 & 2R_2^2-1 & 2R_3^2-1 & \dots & 2R_n^2-1 \\ \vdots & \vdots & \vdots & \vdots & \vdots \end{bmatrix} \begin{bmatrix} dy_1 \\ dy_2 \\ dy_3 \\ \vdots \\ dy_n \end{bmatrix} = \quad \langle\text{Equation 7-2}\rangle$$

$$\begin{bmatrix} C_1 \\ C_3 \\ C_5 \\ \vdots \\ C_{2n-1} \end{bmatrix}$$

As can be seen from the equations 6 and 7, the correlation coefficient matrix may be expressed by the Zernike polynomial transposed matrix ($A^T$) and the matrix (U) of the plurality of overlay measurement values. For example, the correlation coefficient "$C_0$" may correspond to an offset deformation value obtained by adding all the plurality of overlay measurement values 80 corresponding to "$dx_1, dx_2, dx_3, ..., dx_n$". Similarly, the correlation coefficient "$C_1$" may correspond to an offset deformation value obtained by adding all the plurality of overlay measurement values 80 corresponding to "$dy_1, dy_2, dy_3, ..., dy_n$". The correlation coefficients "$C_2$" and "$C_3$" may correspond to scale deformation values obtained by adding all the individual products of the X-axis distances at the positions of ($R_1, \theta_1$), ($R_2, \theta_2$), ($R_3, \theta_3$), ..., ($R_n, \theta_n$) and the plurality of overlay measurement values 80. The correlation coefficients "$C_4$" and "$C_5$" may correspond to scale deformation values obtained by adding all the individual products of the Y-axis distances at the positions of ($R_1, \theta_1$), ($R_2, \theta_2$), ($R_3, \theta_3$), ..., ($R_n, \theta_n$) and the plurality of overlay measurement values 80. Likewise, the correlation coefficients "$C_6$" and "$C_7$" may correspond to high-order deformation values. Accordingly, the overlay measuring equipment 40 may calculate the correlation coefficients at the positions on the substrate 60 by use of the plurality of overlay measurement values (S70).

The overlay measuring equipment 40 may calculate overlay correction value using the correlation coefficient matrix (S80). The overlay correction value may be calculated by the product of the correlation coefficient matrix and the Zernike polynomial matrix in which all of the individual positions at which the overlay pattern is formed in the entire substrate 60 are parameters. For example, the overlay measuring equipment 40 may calculate the overlay correction value in all the shots 70 by multiplying the correlation coefficient matrix by the Zernike polynomial matrix in which the position of each shot of a total of about 100 or more shots 70 on the substrate 60 is the parameter. The overlay measuring equipment 40 may correct the reference map by use of the overlay correction value calculated in each shot 70. Accordingly, the overlay measuring equipment 40 may update the reference map using the overlay correction value, thereby generating the correction map (S90).

The exposure equipment 30 may receive information of the correction map from the overlay measuring equipment 40 via the host computer 10 to perform a corrected (or a compensated) exposure process (S20). The exposure equipment 30 or the host computer 10 may also generate the correction map by use of the correlation coefficient matrix and the overlay correction value. Subsequently, the overlay measuring equipment 40 may repeatedly execute the overlay measuring process in a cycle by resetting the reference map to the correction map. When a certain period expires or the activation of the overlay measuring equipment 40 stops, the overlay measuring process may end.

As a consequence, the method of correcting an overlay according to an exemplary embodiment is capable of calculating the overlay correction value improved in the uniformity of the plurality of overlay measurement values by using the Zernike polynomials of the polar coordinate function. Moreover, it is possible to improve or maximize the reliability of the overlay process, since the uniformity of the overlay correction value may be ensured by permitting the plurality of overlay measurement value to correspond to the polar coordinate function.

As described above, according to the exemplary embodiments, it is possible to calculate the overlay correction value improved in the distribution of the plurality of overlay measurement values by using the Zernike polynomials of the polar coordinate function.

Moreover, it is possible to improve or maximize the reliability in the process of correcting the overlay, since the overlay measuring equipment may generate the correction map from the reference map by using the correlation coefficient multiplied by the Zernike polynomials.

Exemplary embodiments have been disclosed herein, and although specific terms are employed, they are used and are to be interpreted in a generic and descriptive sense only and not for purpose of limitation. Accordingly, it will be apparent to those of ordinary skill in the art that various substitution, modifications and changes may be thereto without departing from the scope and spirit of the invention as set forth in the following claims. The above-disclosed subject matter is to be considered illustrative and not restrictive.

What is claimed is:

1. A method of correcting an overlay, comprising:
setting a reference map having information relating to predetermined positions of a substrate;
measuring an overlay value at each of the predetermined positions to obtain a plurality of overlay measurement values;
applying the plurality of overlay measurement values to a polar coordinate function to calculate a correlation coefficient of the polar coordinate function, wherein parameters of the polar coordinate function include coordinate values of the predetermined positions;
applying the correlation coefficient to the polar coordinate function with each corresponding coordinate value in substantially the reference map being a parameter to calculate an overlay correction value for the corresponding coordinate value; and
generating a correction map such that corresponding positions of the reference map are corrected with corresponding overlay correction values,
wherein the polar coordinate function comprises a Zernike polynomial including a plurality of terms of 1, $R \cos \theta$, $R \sin \theta$, and $(2R^2-1)$ and the product of the Zernike polynomial and the correlation coefficient including at least $C_0$, and
wherein the $C_0$ corresponds to an offset deformation value of the plurality of overlay measurement values, R corresponds to a radial component, and $\theta$ corresponds to an azimuth angle component.

2. The method as claimed in claim 1, wherein the Zernike polynomial further includes a plurality of terms of $R^2 \cos \theta$, $R^2 \sin \theta$, $(3R^3-2R)\cos \theta$, $(3R^3-2R)\sin \theta$, $(6R^4-6R^2+1)$, $R^3 \cos 3\theta$, $R^3 \sin 3\theta$, $(4R^4-3R^2)\cos 2\theta$, $(4R^4-3R^2)\sin 2\theta$, $(10R^5-12R^3+3R)\cos \theta$, $(10R^5-12R^3+3R)\sin \theta$, $20R^6-30R^4+12R^2-1$, $R^4 \cos 4\theta$, $R^4 \sin 4\theta$, $(5R^5+4R^3)\cos 3\theta$, $(5R^5+4R^3)\sin 3\theta$, $(15R^6-20R^4+6R^2)\cos 2\theta$, $(15R^6-20R^4+6R^2)\sin 2\theta$, $(35R^7-60R^5+30R^3-4R)\cos \theta$, $(35R^7-60R^5+30R^3-4R)\sin \theta$, and $70R^8-140R^6+90R^4-20R^2+1$, wherein C corresponds to a correlation coefficient.

3. A method of correcting overlay, comprising:
setting a reference map having information relating to predetermined positions of substrate;
measuring an overlay value at each of the predetermined positions to obtain a plurality of overlay measurement values;
applying the plurality of overlay measurement values to a polar coordinate function to calculate a correlation coefficient of the polar coordinate function, wherein parameters of the polar coordinate function include coordinate values of the predetermined positions;
applying the correlation coefficient to the polar coordinate function with, each corresponding coordinate value in substantially the entire reference map being a parameter, to calculate an overlay correction value for each corresponding coordinate value; and
generating a correction map such that corresponding positions of the reference map are corrected with corresponding overlay correction values,
wherein the polar coordinate function comprises a Zernike polynomial including a plurality of terms of 1, $R \cos \theta$, $R \sin \theta$, and $(2R^2-1)$ and the product of the Zernike polynomial and the correlation coefficient including at least $C_2 R \cos \theta + C_4 R \sin \theta$; and wherein the $C_2$ and $C_4$ correspond to a scale deformation value of the plurality of overlay measurement values, R corresponds to a radial component, and $\theta$ corresponds to an azimuth angle component.

4. A method of correcting overlay comprising:
setting a reference map having information relating to predetermined positions of a substrate;
measuring an overlay value at each of the predetermined positions to obtain a plurality of overlay measurement values;
applying the plurality of overlay measurement values to a polar coordinate function to calculate a correlation coefficient of the polar coordinate function, wherein parameters of the polar coordinate function include coordinate values of the predetermined positions;
applying the correlation coefficient to the polar coordinate function with, each corresponding coordinate value in substantially the entire reference map being a parameter, to calculate an overlay correction value for each corresponding coordinate value; and
generating a correction map such that corresponding positions of the reference map are corrected with corresponding overlay correction values, wherein the polar coordinate function com rises a Zernike polynomial including a plurality of terms of 1, $R \cos \theta$, $R \sin \theta$, and $(2R^2-1)$ and the product of the Zernike polynomial and the correlation coefficient including at least $C_6(2R^2-1)$; and wherein the $C_6$ corresponds to a high-order deformation value, R corresponds to a radial component, and θ corresponds to an azimuth angle component.

5. A method of manufacturing a semiconductor device, the method comprising:
forming a lower pattern on a substrate in a unit process equipment;
forming an upper pattern on the lower pattern with a reference map in an exposure equipment; and
correcting an overlay, the correcting the overlay including:
setting the reference map having information relating to predetermined positions of the substrate;
measuring an overlay value for each of the predetermined positions to obtain a plurality of overlay measurement values corresponding to a distortion degree between the lower pattern and the upper pattern; and
applying the plurality of overlay measurement values to a polar coordinate function to calculate a correlation coefficient of the polar coordinate function, wherein parameters of the polar coordinate function include coordinate values of the predetermined positions and wherein the overlay further includes:
applying the correlation coefficient to the polar coordinate function, with each corresponding coordinate value in substantially the entire reference map being a parameter, to calculate an overlay correction value for each corresponding coordinate value, wherein correcting the overlay further includes generating a correction map such that corresponding positions of the reference map are corrected with corresponding overlay correction values.

6. The method as claimed in claim 5, wherein the polar coordinate function includes a Zernike polynomial.

7. The method as claimed in claim 5, wherein correcting the overlay further includes sending the correction map to the exposure equipment in an overlay measuring equipment.

* * * * *